(12) United States Patent
Chen et al.

(10) Patent No.: US 11,765,503 B2
(45) Date of Patent: Sep. 19, 2023

(54) INTEGRATED ACTIVE NOISE-CANCELING WIRELESS BLUETOOTH HEADPHONE

(71) Applicant: Jian Deng, Shenzhen (CN)

(72) Inventors: Jun Chen, Shenzhen (CN); Jian Deng, Shenzhen (CN)

( * ) Notice: Subject to any disclaimer, the term of this patent is extended or adjusted under 35 U.S.C. 154(b) by 140 days.

(21) Appl. No.: 17/367,617

(22) Filed: Jul. 5, 2021

(65) Prior Publication Data

US 2022/0337948 A1 Oct. 20, 2022

(30) Foreign Application Priority Data

Apr. 15, 2021 (CN) .......................... 202110408898.6

(51) Int. Cl.
*H04R 3/02* (2006.01)
*H05K 1/18* (2006.01)
*H05K 7/14* (2006.01)

(52) U.S. Cl.
CPC ................. *H04R 3/02* (2013.01); *H05K 1/18* (2013.01); *H05K 7/1427* (2013.01); *H05K 2201/10151* (2013.01)

(58) Field of Classification Search
None
See application file for complete search history.

(56) References Cited

U.S. PATENT DOCUMENTS

| 10,484,792 B2 | 11/2019 | Sheffield |
| 10,827,249 B1* | 11/2020 | Pine ..................... H04R 1/1041 |
| 2017/0193979 A1 | 7/2017 | Benway et al. |
| 2019/0327551 A1 | 10/2019 | Al-Amin |
| 2021/0250696 A1* | 8/2021 | Qi .......................... H04R 9/025 |

FOREIGN PATENT DOCUMENTS

CN 109348340 A 2/2019

* cited by examiner

*Primary Examiner* — Kenny H Truong

(57) ABSTRACT

The present disclosure relates to an integrated active noise-canceling wireless Bluetooth headphone, which comprises a housing assembly, primary and secondary magnet sets, primary and secondary magnetic conductive sheet sets, an integrated circuit board assembly, a bracket and a tuning net. The primary and secondary magnet sets, the primary and secondary magnetic conductive sheet sets, the integrated circuit board assembly and the bracket are sequentially laminated in the housing assembly; the tuning net is arranged on an outer surface above the housing assembly; the integrated circuit board assembly is integrated; the periphery of the integrated circuit board assembly is exposed outside the housing assembly; a noise-canceling speaker module interface is embedded in the exposed part of the integrated circuit board and electrically connected with the integrated circuit board; and a light-sensing in-ear detector is surface-mounted on the integrated circuit board.

9 Claims, 5 Drawing Sheets

US 11,765,503 B2

INTEGRATED ACTIVE NOISE-CANCELING WIRELESS BLUETOOTH HEADPHONE

CROSS REFERENCE TO RELATED APPLICATIONS

This application claims foreign priority of Chinese Patent Application No. 202110408898.6, filed on Apr. 25, 2021 in the China National Intellectual Property Administration, the disclosures of all of which are hereby incorporated by reference.

TECHNICAL FIELD

The present disclosure belongs to the technical field of product manufacturing, and particularly relates to an integrated active noise-canceling wireless Bluetooth headphone.

BACKGROUND OF THE PRESENT DISCLOSURE

The active noise-canceling headphone, such as an active noise-canceling wireless Bluetooth headphone, collects external environmental noise through a noise-canceling microphone inside the headphone; the noise is processed by relevant circuits and a master control (Bluetooth) chip, and is transformed by a system into an inverted acoustic signal to be outputted to a speaker end; and finally; the sounds comprising an environmental noise and an inverted environmental noise are heard by human ears. The two noises are superposed to cancel the noise in the senses. However, the existing noise-canceling headphones are provided with a plurality of internal elements, and the elements are connected in unreliable manners, so that the production cost is high, and the noise-canceling headphones still cannot be popularized on a large scale.

How to reduce the production cost of the existing noise-canceling headphones to popularize the noise-canceling headphones on a large scale is an urgent problem to be solved.

SUMMARY OF PRESENT DISCLOSURE

A main purpose of the present disclosure is to provide an integrated active noise-canceling wireless Bluetooth headphone. A noise-canceling speaker, a noise-canceling microphone and a light-sensing in-ear detector are integrated to form a noise-canceling module through a module interface; and the noise-canceling module interface is connected with a main control PCB (Printed Circuit Board) through a socket or a connecting finger. The noise-canceling speaker according to the present disclosure exerts the optimum state and, performance of a vibration system through a single magnetic drive system or a double magnetic drive system, so as to reduce the production cost and the manufacturing cost of the existing noise-canceling headphones, so that the noise-canceling headphones can be popularized on a large scale.

To achieve the above purpose, the present disclosure provides an integrated active noise-canceling wireless Bluetooth headphone, which comprises a housing assembly, primary and secondary magnet sets, primary and secondary magnetic conductive sheet sets, an integrated circuit board assembly, a bracket and a tuning net. The primary and secondary magnet sets, the primary and secondary magnetic conductive sheet, sets, the integrated circuit board assembly and the bracket are sequentially laminated in the housing assembly. The tuning net is arranged on an outer surface above the housing assembly.

The integrated circuit board assembly comprises an integrated circuit board, a light-sensing in-ear detector, a noise-canceling microphone and a noise-canceling speaker module interface. The light-sensing in-ear detector is embedded in the integrated circuit board through a light-sensing in-ear detector interface. The noise-canceling speaker module interface is configured to be electrically connected with a noise-canceling speaker. The light-sensing in-ear detector, the noise-canceling microphone and the light-sensing in-ear detector interface are integrated with the integrated circuit board respectively.

The periphery of the integrated circuit board assembly is exposed outside the housing assembly. The noise-canceling speaker module interface is embedded in the exposed part of the integrated circuit board and electrically connected with the integrated circuit board. The light-sensing in-ear detector is surface-mounted on the integrated circuit board.

Preferably, the housing assembly comprises a U-shaped ferromagnetic cover and a vibration protection bottom cover. An outer diameter of the U-shaped ferromagnetic cover is matched with an inner diameter of the vibration protection bottom cover. A lower end of the U-shaped ferromagnetic cover is connected with one end of the bracket to form a first cavity; and an upper end of the vibration protection bottom cover is connected with the other end of the bracket to form a second cavity.

Preferably, the primary and secondary magnet sets comprise a primary magnet coil, a secondary magnet coil and a vibration voice coil. One end of the primary magnet coil is located in the first cavity; and the other end of the primary magnet coil is located in the second cavity. The vibration voice coil is sleeved, on the primary magnet coil and located in the first cavity. The secondary magnet coil encloses the vibration voice coil and is located in the first cavity.

Preferably the primary and secondary magnetic conductive sheet sets comprise a primary magnetic conductive sheet, a vibration plate and a secondary magnetic conductive sheet. The vibration plate is arranged between the bracket and a vibration protection bottom cover bracket. The primary magnetic conductive sheet is arranged on the vibration plate. The secondary magnetic conductive sheet encloses the primary magnetic conductive sheet and is located at the same level as the integrated circuit board.

Preferably, the integrated active noise-canceling wireless Bluetooth headphone further comprises an integrated circuit board assembly, which comprises an integrated circuit board, a noise-canceling microphone, a light-sensing in-ear detector interface, a light-sensing in-ear detector and a noise-canceling speaker module interface. The noise-canceling microphone is arranged on an outer surface of a lower end of the vibration protection bottom cover. The integrated circuit board (FPC (Flexible Printed Circuit) or rigid-flex board) is reflexed and embedded in the outer surface of the lower end of the vibration protection bottom cover. The noise-canceling microphone, the light-sensing in-ear detector interface and the light-sensing in-ear detector are electrically connected with the integrated circuit board (FPC or rigid-flex board) in a surface mounting manner. The integrated circuit board (FPC or rigid-flex board) is connected with an external main control PCB through the noise-canceling speaker module interface.

Preferably, the integrated circuit board is an FPC or rigid-flex board.

Preferably, axes of the U-shaped ferromagnetic cover, the vibration protection bottom cover, the primary magnet coil, the secondary magnet coil, the vibration voice coil, the primary magnetic conductive sheet, the vibration plate and the secondary magnetic conductive sheet are located on the same vertical line.

Preferably, the noise-canceling speaker is composed of the housing assembly, the primary and secondary magnet sets, the primary and secondary magnetic conductive sheet sets and the bracket which are integrated with the noise-canceling microphone, the light-sensing in-ear detector and the light-sensing in-ear detector interface and arranged on the exposed part of the integrated circuit board assembly.

Preferably, the integrated active noise-canceling wireless Bluetooth headphone has an overall height of 2.8-4.5 mm and a maximum diameter of 8-15 mm.

Compared with the prior art, the present disclosure has the beneficial technical effects that: the noise-canceling speaker, the noise-canceling microphone and the light-sensing in-car detector are, integrated to form the noise-canceling module through the module interface; and the noise-canceling module interface is connected with the integrated circuit board (i.e., the main control PCB) through the socket or the connecting finger to form an integrated structure. The noise-canceling speaker according to the present disclosure exerts the optimum state and performance of the vibration system through the single magnetic drive system or the double magnetic drive system. The integrated structure greatly reduces the production cost of the noise-canceling headphone and improves the assembly efficiency of the noise-canceling headphone, so that the noise-canceling headphone can be popularized on a large scale.

DESCRIPTION OF REFERENCE NUMERALS

Figure 1:
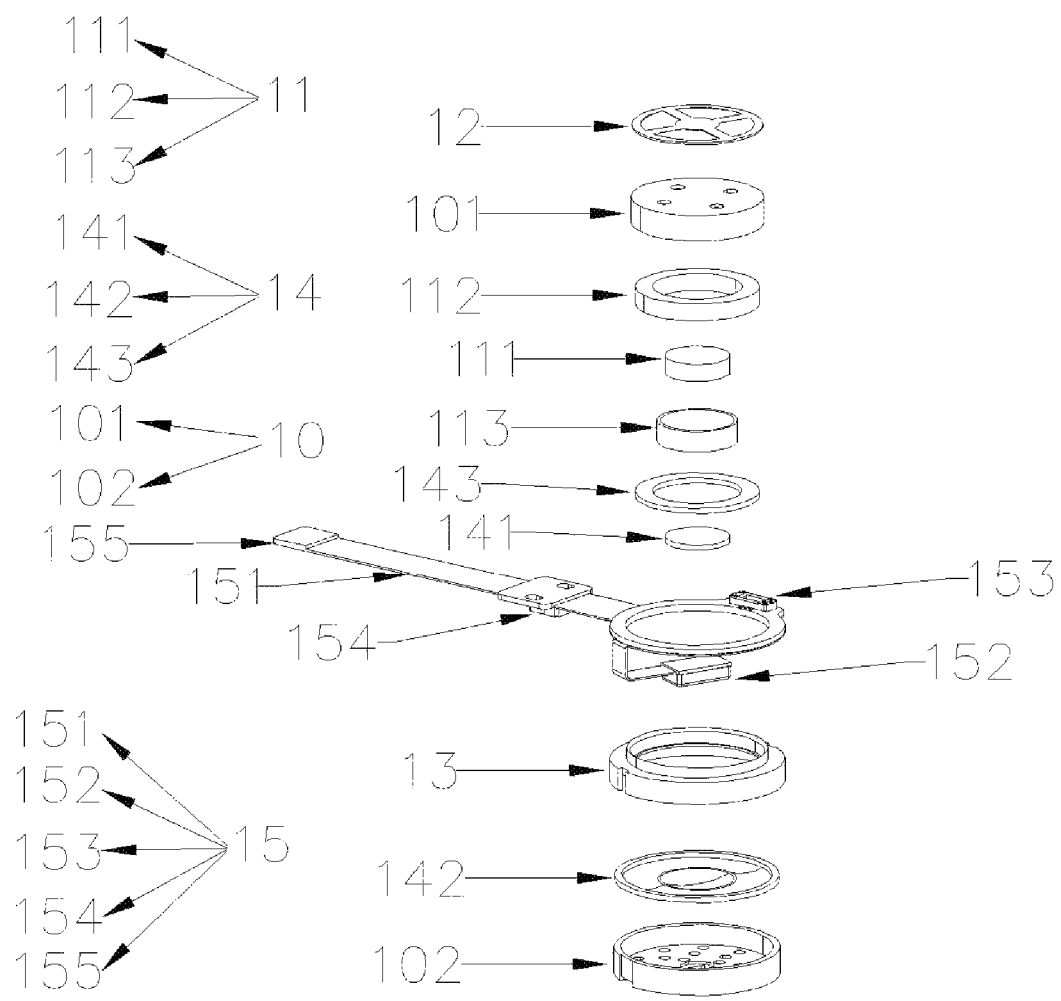
FIG. 1 is an exploded view of an integrated active noise-canceling wireless Bluetooth headphone according to an embodiment of the present disclosure.
Figure 2:
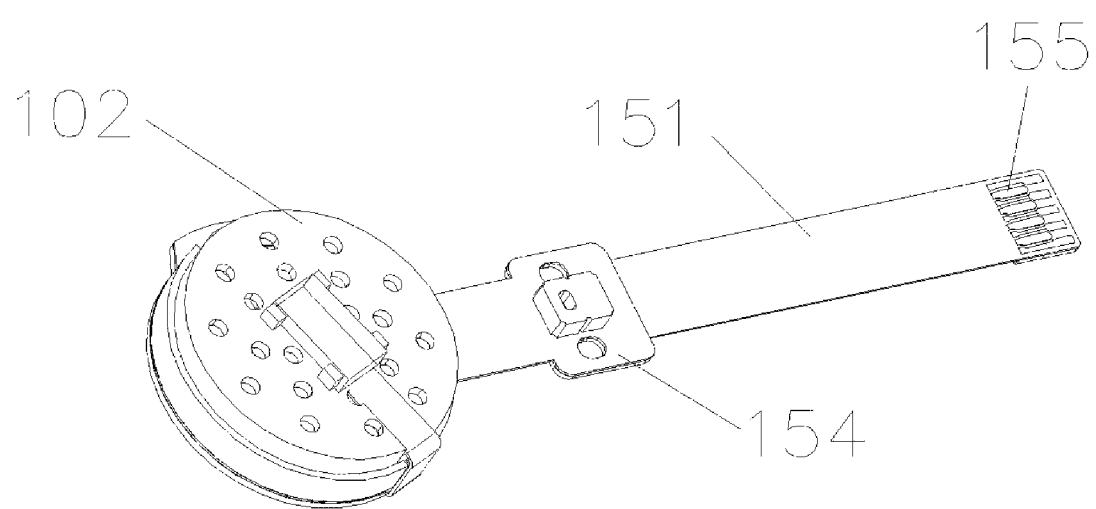
FIG. 2 is a stereogram of an integrated active noise-canceling wireless Bluetooth headphone according to an embodiment of the present disclosure.
Figure 3:
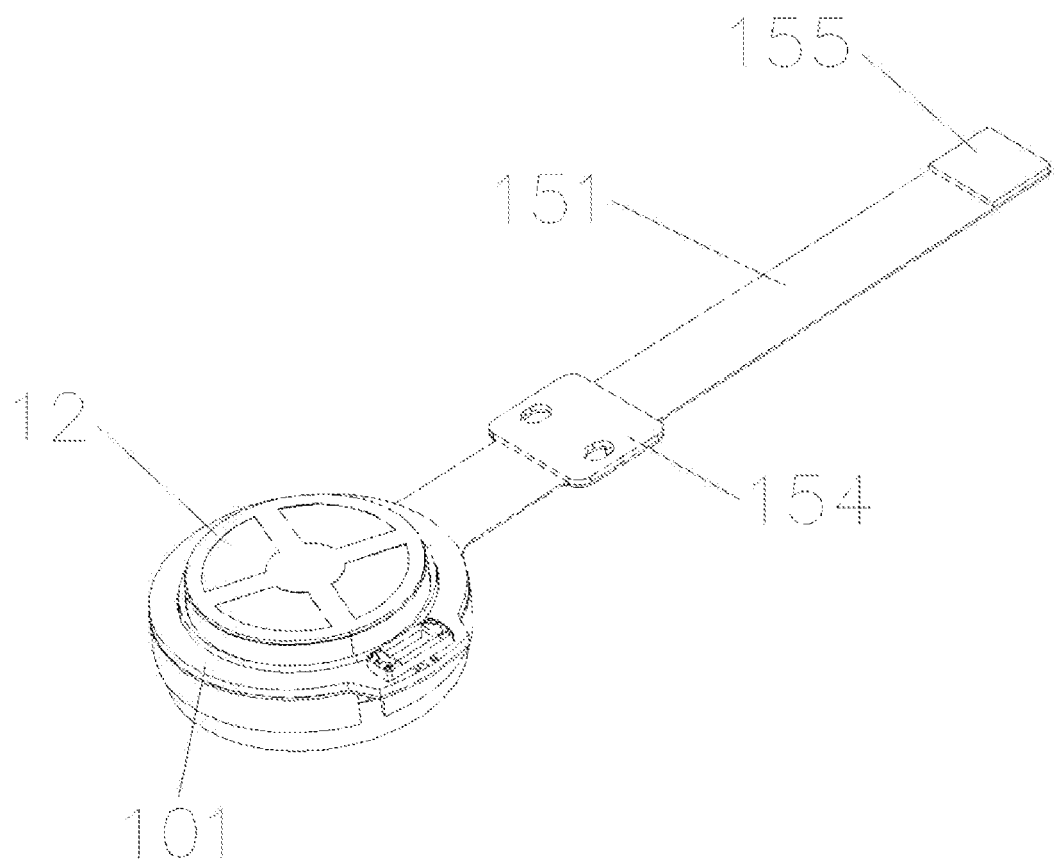
FIG. 3 is a stereogram of an integrated active noise-canceling wireless Bluetooth headphone from another perspective according to an embodiment of the present disclosure.
Figure 4:
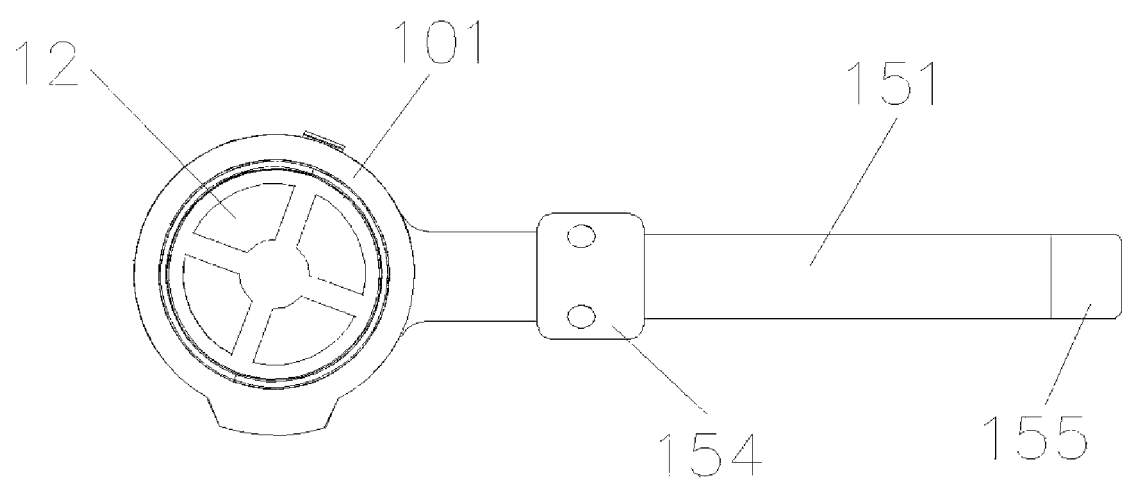
FIG. 4 is a sectional view of an integrated active noise-canceling wireless Bluetooth headphone according to an embodiment of the present disclosure.

| Numeral | Name |
|---|---|
| 10 | Housing assembly |
| 11 | Primary and secondary magnet sets |
| 12 | Tuning net |
| 13 | Bracket |
| 14 | Primary and secondary magnetic conductive sheet sets |
| 15 | Integrated circuit board assembly |
| 101 | U-shaped ferromagnetic cover |
| 102 | Vibration protection bottom cover |
| 111 | Primary magnet coil |
| 112 | Secondary magnet coil |
| 113 | Vibration voice coil |
| 141 | Primary magnetic conductive sheet |
| 142 | Vibration plate |
| 143 | Secondary magnetic conductive sheet |
| 151 | Integrated circuit board (FPC or rigid-flex board) |
| 152 | Noise-canceling microphone |
| 153 | Light-sensing in-ear detector interface |
| 154 | Light-sensing in-ear detector |
| 155 | Noise-canceling speaker module interface |

DETAILED DESCRIPTION OF PREFERRED EMBODIMENTS

To make the purpose, the technical solutions and the advantages of the present disclosure more clear, the present disclosure will, be further described below in detail in combination with the drawings and the embodiments. It should be understood that the specific embodiments described herein are only used for explaining the present disclosure, not used for limiting the present disclosure.

The technical solutions in the embodiments of the present disclosure will be clearly and fully described below in combination with the drawings in the embodiments of the present disclosure. Apparently, the described embodiments are merely part of the embodiments of the present disclosure, not all of the embodiments. Based on the embodiments in the present disclosure, all other embodiments obtained by those ordinary skilled in the art without contributing creative labor will belong to the protection scope of the present disclosure.

It should be noted that all directional indications in the embodiments of the present disclosure (such as upper, lower, left, right, forward and back) are only used to explain the relative position relationship and movement among the components in a particular attitude (as shown in the figures). If the particular attitude changes, the directional indications are changed accordingly.

In addition, the terms such as "first" and "second" in the present disclosure are only used for the purpose of description, rather than being understood to indicate or imply relative importance or hint the number of indicated technical features. Thus, the features limited by "first" and "second" can explicitly or impliedly comprise at least one of the features. In addition, the technical solutions in various embodiments may be combined, but only on the basis that the combination can be implemented by those ordinary skilled in the art. When the combination of the technical solutions is contradictory or impossible to be realized, the combination of the technical solutions shall be considered non-existent and is not within the protection scope of the present disclosure.

As shown in FIGS. 1-4, the present embodiment provides an integrated active noise-canceling wireless Bluetooth headphone, which comprises a housing assembly 10, primary and secondary magnet sets 11, primary and secondary magnetic conductive sheet sets 14, an integrated circuit board assembly 15, a bracket 13 and a tuning net 12. The primary and secondary magnet sets 11, the primary and secondary magnetic conductive sheet sets 14, the integrated circuit board assembly 15 and the bracket 13 are sequentially laminated in the housing assembly 10. The tuning net 12 is arranged on an outer surface above the housing assembly 10.

The integrated circuit board assembly 15 comprises an integrated circuit board 151, a light-sensing in-ear detector 154, a noise-canceling microphone 152 and a noise-canceling speaker module interface 155. The light-sensing in-ear detector 154 is embedded in the integrated circuit board 15 through a light-sensing in-ear detector interface 156. The noise-canceling speaker module interface 155 is configured to be electrically connected with a noise-canceling speaker (not shown in the figures). The light-sensing in-ear detector 154, the noise-canceling microphone 152 and the light-sensing in-ear detector interface 155 are integrated with the integrated circuit board 15 respectively.

Specifically, the periphery of the integrated circuit board assembly 15 is exposed outside the housing assembly 10. The noise-canceling speaker module interface 155 is embedded in the exposed part of the integrated circuit board 151 and electrically connected with the integrated circuit board 151. The light-sensing in-ear detector 154 is surface-mounted on the integrated circuit board 151.

In the present disclosure, the noise-canceling speaker, the noise-canceling microphone 152 and the light-sensing in-ear detector 154 are integrated to form a noise-canceling module through a module interface; and the noise-canceling module interface is connected with the integrated circuit board 151 (i.e., a main control PCB) through a socket or a connecting finger to form an integrated structure. Meanwhile, the noise-canceling speaker exerts the optimum state and performance of a vibration system through a single magnetic drive system or a double magnetic drive system. The integrated structure greatly reduces the production cost of the noise-canceling headphone and improves the assembly efficiency of the noise-canceling headphone, so that the noise-canceling headphone can be popularized on a large scale.

In a specific embodiment, the housing assembly 10 comprises a U-shaped ferromagnetic cover 101 and a vibration protection bottom cover 102. The primary and secondary magnet sets 11 comprise a primary magnet coil 111, a secondary magnet coil 112, a vibration voice coil 113 and the bracket 1. The primary and secondary magnetic conductive sheet sets 14 comprise a primary magnetic conductive sheet 141, a secondary magnetic conductive sheet 143 and a vibration plate 142 which are sequentially laminated in the housing assembly 10. The tuning net 12 is arranged on an outer surface above the housing assembly 10.

The integrated circuit board assembly 15 is fixed outside the housing assembly 10. The noise-canceling speaker module interface 155 is connected with the main control PCB through the socket or the connecting finger as an external interface of the noise-canceling module. The light-sensing in-ear detector 154 is surface-mounted on the integrated circuit board 151. The integrated circuit board 151 may be, for example, an FPC or a rigid-flex board. The integrated circuit board 151 is externally connected with a socket, of light-sensing in-ear detector 154 in a surface mounting manner. The noise-canceling microphone 152 is surface-mounted on the integrated circuit board 151 and embedded in the outer surface of the vibration protection bottom cover 102.

It should be noted that the existing active noise-canceling headphones need to be re-molded, which will increase the production cost of noise-canceling headphones, so that the existing active noise-canceling headphones cannot be popularized on a large scale. For the integrated active noise-canceling headphone, in the present application, the integrated circuit board assembly 15 constitutes a core noise-canceling unit of the headphone, and is suitable for Bluetooth headphones, neck-band headphones, wired headphones and head-band headphones. The existing headphones can be transformed into intelligent noise-canceling headphones by replacing the arrangement with the active noise-canceling speaker module unit and optionally adding the light-sensing in-ear detector 154. Then, at present, headphone manufacturers will make a set of headphone front cavity molds for each ID when producing TWS (True Wireless Stereo)+ANC (Active Noise Cancellation) noise-canceling wireless Bluetooth headphones as well as neck-band and head-band noise-canceling wireless Bluetooth headphones. However, the TWS+ANC noise-canceling wireless Bluetooth headphones and the neck-band noise-canceling wireless Bluetooth headphones on the market are different in appearance (ID) and internal structure of cavity, so that the headphone manufacturers will invest a lot of manpower, material and financial resources to research and develop, and may not achieve the desired effect. Even if the engineering prototype passes the verification, the control of noise-canceling stability and consistency from pilot production (PP) to mass production (MP) will be a painful process for the headphone manufacturers and solution providers. Therefore, an ordinary headphone can be transformed into an intelligent, noise-canceling headphone without the above problems by replacing the original speaker with the integrated circuit board assembly 15 and connecting the external interface of the Bluetooth headphone of the present disclosure with the external main control PCB (not shown in the figures) through the socket or connecting finger of the noise-canceling speaker module interface 155.

In addition, it should be added that the tuning net 12 is arranged to adjust the sound effect according to the environmental conditions around the headphone, reflect the humanized design, and meet the requirements of users. The bracket 13 can be adopted to fix the primary and secondary magnet sets 11 and the primary and secondary magnetic conductive sheet sets 14, so that the primary and secondary magnet sets 11 and the primary and secondary magnetic conductive sheet sets 14 will not move after being used for a long time. The light-sensing in-ear detector 154 is surface-mounted on the integrated circuit board 151 and fixed on a housing of the product through a location hole. Alternatively, the light-sensing in-ear detector 154 can be fixed at any position of the product through a light-sensing in-ear detector interface 153 in the integrated circuit board 151.

The present embodiment provides the integrated active noise-canceling wireless Bluetooth headphone, wherein the integrated circuit board 151 is assembled on the housing bracket 13; the vibration voice coil 113 is electrically connected with the integrated circuit board 151 in a manner of lead attachment; the light-sensing in-ear detector 154 is surface-mounted on the integrated circuit board 151; the integrated circuit board 151 is surface-mounted with the external light; sensing in-ear detector interface 153; the noise-canceling microphone 152 is surface-mounted on the integrated circuit board 151 and embedded in the outer surface of the vibration protection bottom cover 102; and the other end of the integrated circuit board 151 is connected with the main control PCB through the socket or connecting finger of the noise-canceling speaker module interface 155 as the external interface of the Bluetooth headphone. Modularization is adopted to reduce the production cost of the existing noise-canceling headphone, so that the noise-canceling headphone can be popularized on a large scale.

Further, the housing assembly 10 comprises a U-shaped ferromagnetic cover 101 and a vibration protection bottom cover 102. An outer diameter of the U-shaped ferromagnetic cover 10 is matched with an inner diameter of the vibration protection bottom cover 102. A lower end of the U-shaped ferromagnetic cover 101 is connected with one end of the bracket 13 to form a first cavity; and an upper end of the vibration protection bottom cover 102 is connected with the other end of the bracket 13 to form a second cavity.

It should be noted that the outer diameter of the U-shaped ferromagnetic cover 10 is matched with the inner diameter of the vibration protection bottom cover 102; the lower end of the U-shaped ferromagnetic cover 101 is connected with one end of the bracket 13 to form the first cavity; and the upper end of the vibration protection bottom cover 102 is connected with the other end of the bracket 13 to form, the second cavity. The first cavity and the second cavity are formed to prevent other external noises from entering and mixing with sounds played on the speaker noise-canceling unit 13, which may cause unsatisfactory noise-canceling effect.

Further, the primary and secondary magnet sets 11 comprise the primary magnet coil 111, the secondary magnet coil 112 and the vibration voice coil 113. One end of the primary magnet coil 111 is located in the first cavity; and the other end of the primary magnet coil 111 is located in the second cavity. The vibration voice coil 113 is sleeved on the primary magnet coil 111 and located in the first cavity. The secondary magnet coil encloses the vibration voice coil 113 and is located in the first cavity.

It should be noted that one end of the primary magnet coil 111 is located in the first cavity, and the other end of the primary magnet coil 111 is located in the second cavity; the vibration voice coil 113 is sleeved on the primary magnet coil 111 and located in the first cavity; and the secondary magnet, coil 112 encloses the vibration voice coil 113 and is located in the first cavity, so that the sound effect, of the headphone becomes better. The primary magnet coil 111 and the secondary magnet coil 112 can increase the magnetic flux and the magnetic field density.

Further, the primary and secondary magnetic conductive sheet sets 14 comprise the primary magnetic conductive sheet 141, the vibration plate 142 and the secondary magnetic conductive sheet 143. The vibration plate 142 is arranged between the bracket 13 and the bracket 13 of the vibration protection bottom cover 102. The primary magnetic conductive sheet 141 is arranged on the vibration plate 142. The secondary magnetic conductive sheet 143 encloses the primary magnetic conductive sheet 141 and is located at the same level as the integrated circuit board 151.

It should be noted that the DVS+ANC noise-canceling wireless Bluetooth headphone and neck-band noise-canceling wireless Bluetooth headphone on the market cannot achieve long battery life due to small battery capacity. When producing the TWS+ANC noise-canceling wireless Bluetooth headphone and neck-band noise-canceling wireless Bluetooth headphone, the headphone manufacturers will lower the sound quality and the sound effect of the TWS+ANC noise-canceling wireless Bluetooth headphone and neck-band noise-canceling wireless Bluetooth headphone in order to achieve the noise-canceling effect. ANC (Feedback Active Noise Cancellation) and Hybrid ANC have problems of difficult mass production, low first pass yield, low productivity and the like. The primary magnetic conductive sheet 141 and the secondary magnetic conductive sheet 143 can prevent the magnetic field from leaking and affecting the sound quality. The vibration protection bottom cover 102 can prevent the vibration plate 142 from touching other foreign objects and producing noise.

It should be noted that the noise-canceling microphone 152 is connected with the integrated circuit board 151, so that deep noise cancellation can be conducted on some disturbing and confusing sounds by realizing hybrid deep noise cancellation.

It should be noted that the FPC or rigid-flex board can be provided to reduce the space occupied by the whole active noise-canceling Bluetooth headphone and reduce the production and processing cost of the active noise-canceling Bluetooth headphone. In the present embodiment, the integrated circuit board 151 is the FPC board.

Further, axes of the U-shaped ferromagnetic cover 101, the vibration protection bottom cover 102, the primary magnet coil 111, the secondary magnet coil 112, the vibration voice coil 113, the primary magnetic conductive sheet 141, the vibration plate 142 and the secondary magnetic conductive sheet 143 are located on the same vertical line.

It should be noted that the axes of the U-shaped ferromagnetic cover 101, the vibration protection bottom cover 102, the primary magnet coil 111, the secondary magnet coil 112, the vibration voice coil 113, the primary magnetic conductive sheet 141, the vibration plate 142 and the secondary magnetic conductive sheet 143 are located on the same vertical line, so that the above components of the active noise-canceling headphone of the present application will continuously vibrate at the same frequency without affecting the positional relationship of all the components, thereby avoiding distortion of sound after long-term use.

Further, the integrated active noise-canceling wireless Bluetooth headphone also comprises the integrated circuit board assembly 15 which comprises the integrated circuit board 151, the noise-canceling, microphone 152, the light-sensing in-ear detector interface 153, the light-sensing in-ear detector 154 and the noise-canceling speaker module interface 155. The noise-canceling microphone 152 is arranged on an outer surface of a lower end of the vibration protection bottom cover 102. The integrated circuit board 151 (FPC or rigid-flex board) is reflexed and embedded in the outer surface of the lower end of the vibration protection bottom cover 102. The noise-canceling microphone 152, the light-sensing in-ear detector interface 153 and the light-sensing in-ear detector 154 are electrically connected with the integrated circuit board 151 (FPC or rigid-flex board) in a surface mounting manner. The integrated circuit board 151 (FPC or rigid-flex board) is connected with an external main control PCB through the noise-canceling speaker module interface 155.

Preferably, the integrated circuit board 151 is an FPC or rigid-flex board.

It should be noted that the noise-canceling microphone 152, the light-sensing in-ear detector interface 153 and the light-sensing in-ear detector 154 are electrically connected with the integrated circuit board 151 (FPC or rigid-flex board) in the surface mounting manner, so that deep noise cancellation can be conducted on some disturbing and confusing sounds by realizing hybrid deep noise cancellation.

In an embodiment, the integrated circuit board 151 is the FPC board. It should be noted that the FPC board can be provided to reduce the space occupied by the whole active noise-canceling Bluetooth headphone and reduce the production and processing cost of the active noise-canceling Bluetooth headphone.

Further, the noise-canceling speaker comprises a feedback noise-canceling microphone, a light-sensing detection circuit and a speaker which are integrally arranged on the exposed part of the integrated circuit board 151.

It should be noted that the light-sensing detection circuit, the feedback noise-canceling microphone and the speaker can be integrated to transform the ordinary headphone into the noise-canceling headphone.

According to the preset requirements, the light-sensing, detection circuit may be operative or inoperative as needed. The light-sensing detection circuit may be connected with a main PCB of the headphone through the noise-canceling speaker module interface 155 in a wire-plugging manner during production operation, thereby improving the production efficiency and stability.

Further, the integrated active noise-canceling wireless Bluetooth headphone has an overall height of 2.8-4.5 mm and a maximum diameter of 8-15 mm.

Figure 5:
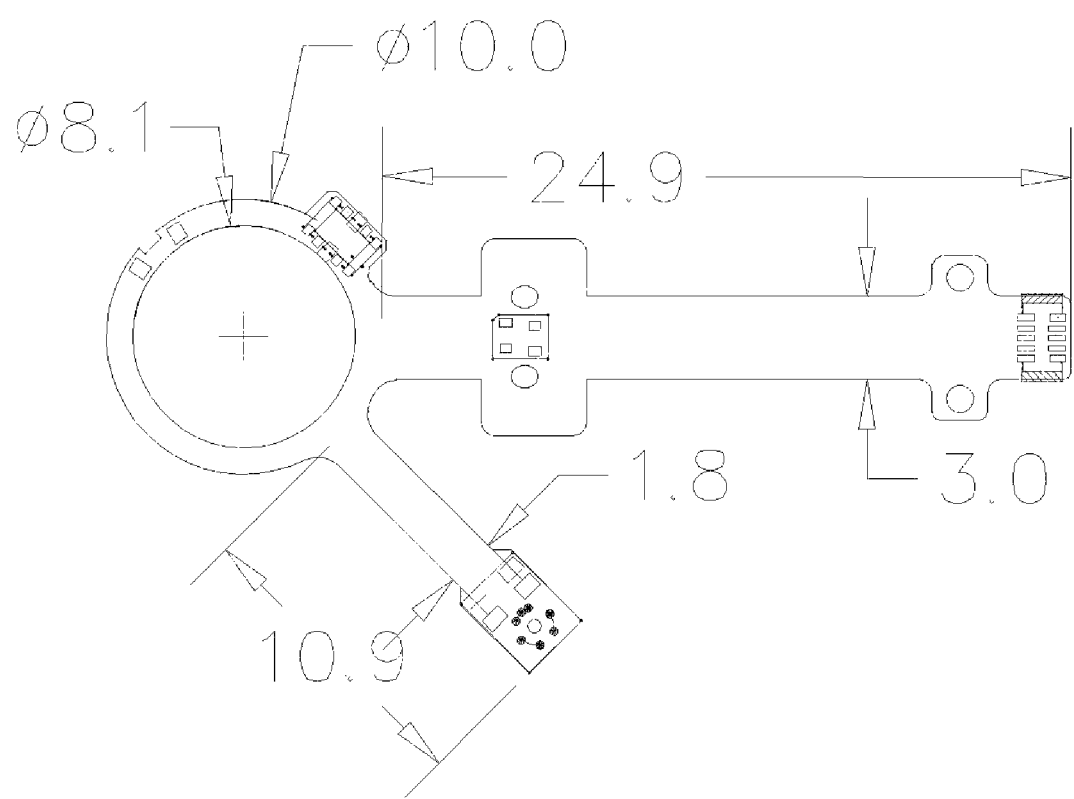
FIG. 5 is a detailed size diagram of an integrated active noise-canceling wireless Bluetooth headphone according to an embodiment of the present disclosure.

It should be noted that, referring to FIG. 5, the overall height of the integrated active noise-canceling wireless Bluetooth headphone in the present application is set to 2.8-4.5 mm, and the maximum diameter is set to 8-15 mm, so that the active noise-canceling headphone in the present application can, meet the existing use requirements of consumers. In the present specific embodiment the U-shaped ferromagnetic cover 101 has an outer diameter of 10.0 mm and an inner diameter of 8.1 mm; a distance between the noise-canceling speaker module interface 155 and an outer edge of the housing assembly 10 is 24.9 mm; the integrated circuit board 151 has a width of 3.0 mm; a distance between the noise-canceling microphone 152 and the outer edge of the housing assembly 10 is 10.9 mm; and the noise-canceling microphone 152 has a width of 1.8 mm.

The above only describes preferred specific embodiments of the present disclosure, but the protection scope of the present disclosure is not limited thereto. Any change or replacement contemplated easily by those skilled in the art familiar with the technical field within the technical scope disclosed by the present disclosure shall be covered within the protection scope of the present disclosure. Therefore, the protection scope of the present disclosure shall be determined by the protection scope of the claims.

What is claimed is:

1. An integrated active noise-canceling wireless Bluetooth headphone, comprising a housing assembly, primary and secondary magnet sets, primary and secondary magnetic conductive sheet sets, an integrated circuit board assembly, a bracket and a tuning net, wherein the primary and secondary magnet sets, the primary and secondary magnetic conductive sheet sets, the integrated circuit board assembly and the bracket are sequentially laminated in the housing assembly; and the tuning net is arranged on an outer surface above the housing assembly;

wherein the integrated circuit board assembly comprises an integrated circuit board, a light-sensing in-ear detector, a noise-canceling microphone and a noise-canceling speaker module interface; the light-sensing in-ear detector is embedded in the integrated circuit board through a light-sensing in-ear detector interface; the noise-canceling speaker module interface is configured to be electrically connected with a noise-canceling speaker; and the light-sensing in-ear detector, the noise-canceling microphone and the light-sensing in-ear detector interface are integrated with the integrated circuit board respectively;

the periphery of the integrated circuit board assembly is exposed outside the housing assembly;

the noise-canceling speaker module interface is embedded in the exposed part of the integrated circuit board and electrically connected with the integrated circuit board; and the light-sensing in-car detector is surface-mounted on the integrated circuit board.

2. The integrated active noise-canceling wireless Bluetooth headphone according to claim 1, wherein the housing assembly comprises a U-shaped ferromagnetic cover and a vibration protection bottom cover; an outer diameter of the U-shaped ferromagnetic cover is matched with an inner diameter of the vibration protection bottom cover; a lower end of the U-shaped ferromagnetic cover is connected with one end of the bracket to form a first cavity; and an upper end of the vibration protection bottom cover is connected with the other end of the bracket to form a second cavity.

3. The integrated active noise-canceling wireless Bluetooth headphone according to claim 2, wherein the primary and secondary magnet sets comprise a primary magnet coil, a secondary magnet coil and a vibration voice coil; one end of the primary magnet coil is located in the first cavity; the other end of the primary magnet coil is located in the second cavity; the vibration voice coil is sleeved on the primary magnet coil and located in the first cavity; and the secondary magnet coil encloses the vibration voice coil and is located in the first cavity.

4. The integrated active noise-canceling wireless Bluetooth headphone according to claim 3, wherein the primary and secondary magnetic conductive sheet sets comprise a primary magnetic conductive sheet, a vibration plate and a secondary magnetic conductive sheet; the vibration plate is arranged between the bracket and a vibration protection bottom cover bracket; the primary magnetic conductive sheet is arranged on the vibration plate;

and the secondary magnetic conductive sheet encloses the primary magnetic conductive sheet and is located at the same level as the integrated circuit board.

5. The integrated active noise-canceling wireless Bluetooth headphone according to claim 4, wherein axes of the U-shaped ferromagnetic cover, the vibration protection bottom cover, the primary magnet coil, the secondary magnet coil, the vibration voice coil, the primary magnetic conductive sheet, the vibration plate and the secondary magnetic conductive sheet are located on the same vertical line.

6. The integrated active noise-canceling wireless Bluetooth headphone according to claim 2, wherein the noise-canceling microphone is arranged on an outer surface of a lower end of the vibration protection bottom cover; the integrated circuit board is reflexed and embedded in the outer surface of the lower end of the vibration protection bottom cover; the noise-canceling microphone, the light-sensing in-ear detector interface and the light-sensing in-ear detector are electrically connected with the integrated circuit board in a surface mounting manner; and the integrated circuit board is connected with an external main, control PCB through the noise-canceling speaker module interface.

7. The integrated active noise-canceling wireless Bluetooth headphone according to claim 6, wherein the integrated circuit board is a flexible printed circuit or a rigid-flex board.

8. The integrated active noise-canceling wireless Bluetooth headphone according to claim 1, wherein the noise-canceling speaker comprises a feedback noise-canceling microphone, a light-sensing detection circuit and a speaker which are integrally arranged on the exposed part of the integrated circuit board assembly.

9. The integrated active noise-canceling wireless Bluetooth headphone according to claim 1, wherein the integrated active noise-canceling wireless Bluetooth headphone has an overall height of 2.8-4.5 mm and a maximum diameter of 8-15 mm.

* * * * *